(12) United States Patent
Tajima et al.

(10) Patent No.: US 11,480,621 B2
(45) Date of Patent: Oct. 25, 2022

(54) CAPACITY ESTIMATION METHOD AND CAPACITY ESTIMATION SYSTEM FOR POWER STORAGE DEVICE

(71) Applicant: SEMICONDUCTOR ENERGY LABORATORY CO., LTD., Atsugi (JP)

(72) Inventors: Ryota Tajima, Kanagawa (JP); Toshiyuki Isa, Kanagawa (JP); Akihiro Chida, Kanagawa (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 72 days.

(21) Appl. No.: 16/753,839

(22) PCT Filed: Oct. 25, 2018

(86) PCT No.: PCT/IB2018/058315
§ 371 (c)(1),
(2) Date: Apr. 6, 2020

(87) PCT Pub. No.: WO2019/087018
PCT Pub. Date: May 9, 2019

(65) Prior Publication Data
US 2020/0292624 A1    Sep. 17, 2020

(30) Foreign Application Priority Data

Nov. 2, 2017    (JP) .............................. JP2017-213051

(51) Int. Cl.
*G01R 31/387* (2019.01)
*H02J 9/06* (2006.01)
(52) U.S. Cl.
CPC .............. *G01R 31/387* (2019.01); *H02J 9/06* (2013.01)

(58) Field of Classification Search
CPC .. G01R 31/387; G01R 31/392; G01R 31/367; H02J 9/06; H02J 7/005; H02J 7/0048; H02J 2310/48; Y02T 10/70
See application file for complete search history.

(56) References Cited

U.S. PATENT DOCUMENTS 7,554,296 B2    6/2009    Mizuno et al.
9,081,068 B2    7/2015    Mattisson et al.
(Continued)

FOREIGN PATENT DOCUMENTS

CN    101067644 A    11/2007
CN    10362091 A    3/2014
(Continued)

OTHER PUBLICATIONS

International Search Report (Application No. PCT/IB2018/058315) dated Jan. 8, 2019.
(Continued)

*Primary Examiner* — Stacy Whitmore
(74) *Attorney, Agent, or Firm* — Nixon Peabody LLP; Jeffrey L. Costellia

(57) ABSTRACT

It is difficult to know the remaining amount and the degradation state of a power storage device, and it is also difficult to estimate how long the power storage device can be used. Data obtained through midway discharge and mid-to-full charge is used as the learning data to calculate the degradation state and the capacity. In other words, the learning data includes both a discharge curve of midway discharge and a charge curve of mid-to-full charge, and neural network processing is performed with the use of the learned data.

8 Claims, 7 Drawing Sheets

(56) References Cited

U.S. PATENT DOCUMENTS

| | | |
|---|---|---|
| 9,404,950 B2 | 8/2016 | Lafontaine et al. |
| 9,618,954 B2 | 4/2017 | Masuda et al. |
| 9,651,628 B2 | 5/2017 | Mattisson et al. |
| 9,711,994 B2 | 7/2017 | Yamazaki |
| 9,726,701 B2 | 8/2017 | Lafontaine et al. |
| 9,746,506 B2 | 8/2017 | Lafontaine et al. |
| 9,983,243 B2 | 5/2018 | Lafontaine et al. |
| 10,011,188 B2* | 7/2018 | Minamiura ............ B60W 20/15 |
| 10,101,370 B2 | 10/2018 | Lafontaine et al. |
| 10,124,682 B2 | 11/2018 | Tsuchiya |
| 10,310,022 B2* | 6/2019 | Park ...................... G01R 31/378 |
| 10,359,474 B2* | 7/2019 | Soga ................. G01R 31/3648 |
| 10,386,418 B2* | 8/2019 | Takegami ............. H01M 10/44 |
| 10,459,037 B2* | 10/2019 | Nishigaki .......... G01R 31/3648 |
| 10,530,189 B2 | 1/2020 | Yamazaki |
| 10,775,439 B2* | 9/2020 | Song .................. H01M 10/486 |
| 10,938,075 B2* | 3/2021 | Fujita .................... B60L 58/16 |
| 11,215,675 B2* | 1/2022 | Shin .................. G01R 31/3835 |
| 2006/0064130 A1* | 3/2006 | Dodd .................... A61N 1/3956 607/5 |
| 2006/0181245 A1 | 8/2006 | Mizuno et al. |
| 2008/0084185 A1* | 4/2008 | Nakazawa ............. H02J 9/061 320/128 |
| 2012/0065827 A1* | 3/2012 | Kimura .................. B60L 58/18 701/22 |
| 2012/0177974 A1* | 7/2012 | Nakajima ............. H01M 4/62 429/144 |
| 2014/0077815 A1 | 3/2014 | Mattisson et al. |
| 2014/0125281 A1 | 5/2014 | Mitsutani |
| 2014/0167704 A1 | 6/2014 | Lafontaine et al. |
| 2014/0236379 A1 | 8/2014 | Masuda et al. |
| 2014/0329118 A1* | 11/2014 | Nagase ................ H01M 4/131 429/66 |
| 2016/0011273 A1 | 1/2016 | Mattisson et al. |
| 2016/0049821 A1 | 2/2016 | Aridome |
| 2017/0050527 A1 | 2/2017 | Tsuchiya |
| 2019/0033397 A1* | 1/2019 | Karner ................ G01R 31/371 |
| 2019/0077273 A1* | 3/2019 | Jang ........................ B60L 50/60 |
| 2019/0204369 A1 | 7/2019 | Lafontaine et al. |
| 2020/0001724 A1* | 1/2020 | Jordan, III ........... B60L 53/665 |
| 2020/0076223 A1 | 3/2020 | Kuriki et al. |
| 2020/0116797 A1* | 4/2020 | Tsurutani ............. G01R 31/392 |
| 2020/0132774 A1* | 4/2020 | Hara ...................... G01R 31/36 |
| 2022/0006313 A1* | 1/2022 | Lim ..................... G01R 31/374 |

FOREIGN PATENT DOCUMENTS

| | | |
|---|---|---|
| CN | 103797679 A | 5/2014 |
| CN | 103875148 A | 6/2014 |
| CN | 104969438 A | 10/2015 |
| CN | 104977538 A | 10/2015 |
| CN | 105050855 A | 11/2015 |
| CN | 106467034 A | 3/2017 |
| DE | 102014224608 | 10/2015 |
| EP | 1691209 A | 8/2006 |
| EP | 2725685 A | 4/2014 |
| EP | 2765669 A | 8/2014 |
| EP | 2976233 A | 1/2016 |
| EP | 3211748 A | 8/2017 |
| EP | 3214720 A | 9/2017 |
| EP | 3567697 A | 11/2019 |
| JP | 2006-226789 A | 8/2006 |
| JP | 2006-329707 A | 12/2006 |
| JP | 2011-083166 A | 4/2011 |
| JP | 2012-226410 A | 11/2012 |
| JP | 2014-135884 A | 7/2014 |
| JP | 2014-185896 A | 10/2014 |
| JP | 2015-202010 A | 11/2015 |
| JP | 5812032 | 11/2015 |
| JP | 2016-504903 | 2/2016 |
| JP | 5851514 | 2/2016 |
| JP | 5959566 | 8/2016 |
| JP | 2017-041984 A | 2/2017 |
| KR | 2006-0091269 A | 8/2006 |
| WO | WO-2012/176275 | 12/2012 |
| WO | WO-2013/051151 | 4/2013 |
| WO | WO-2013/057784 | 4/2013 |
| WO | WO-2013/115244 | 8/2013 |
| WO | WO-2014/099716 | 6/2014 |
| WO | WO-2014/099737 | 6/2014 |
| WO | WO-2014/147475 | 9/2014 |

OTHER PUBLICATIONS

Written Opinion (Application No. PCT/IB2018/058315) dated Jan. 8, 2019.

International Search Report (Application No. PCT/IB2018/053273) dated Jul. 24, 2018.

Written Opinion (Application No. PCT/IB2018/053273) dated Jul. 24, 2018.

Chinese Office Action (Application No. 201880065831.3) dated Sep. 5, 2022.

* cited by examiner

CAPACITY ESTIMATION METHOD AND CAPACITY ESTIMATION SYSTEM FOR POWER STORAGE DEVICE

TECHNICAL FIELD

One embodiment of the present invention relates to an object, a method, or a manufacturing method. Alternatively, the present invention relates to a process, a machine, manufacture, or a composition (a composition of matter). One embodiment of the present invention relates to a manufacturing method of a semiconductor device, a display device, a light-emitting device, a power storage device, a lighting device, or an electronic device. In particular, one embodiment of the present invention relates to a capacity estimation method and a capacity estimation system for a power storage device.

Note that in this specification, a power storage device refers to every element and device having a function of storing power. For example, a power storage device includes a storage battery (also referred to as a secondary battery) such as a lithium-ion secondary battery, a lithium-ion capacitor, a nickel hydrogen battery, an all-solid battery, an electric double layer capacitor, and the like.

BACKGROUND ART

In recent years, a variety of power storage devices such as lithium-ion secondary batteries, lithium-ion capacitors, and air batteries have been actively developed. In particular, demand for lithium-ion secondary batteries with high output and high energy density have rapidly grown with the development of the semiconductor industry, for portable information terminals such as mobile phones, smartphones, tablets, and laptop computers; game machines; portable music players; digital cameras; medical equipment; next-generation clean energy vehicles such as hybrid electric vehicles (HEVs), electric vehicles (EVs), and plug-in hybrid electric vehicles (PHEVs); and the like, and the lithium-ion secondary batteries are essential as rechargeable energy supply sources for today's information society.

Furthermore, installation of an uninterruptible power supply (also referred to as an UPS) for devices and facilities and the like that are to be largely damaged or affected in the case where power failure such as a power breakdown occurs due to disasters and the like has been spread.

Typically, an uninterruptible power supply is installed in medical institutions such as hospitals, industrial facilities with a clean room for fabrication of precision equipment, broadcasting stations, commercial facilities such as shopping malls, financial institutions, data centers including a server, and the like.

Furthermore, uninterruptible power supplies have been spread in ordinary households for preventing power breakdown of security systems for home security and power failure of computers. For home security, uninterruptible power supplies are used to manage power supply during a power breakdown.

Patent Document 1 shows an example where a neural network is used for calculation of the remaining capacity of a secondary battery.

PRIOR ART DOCUMENTS

Patent Document

[Patent Document 1] United States Patent Application Publication No. 2006/0181245

SUMMARY OF THE INVENTION

Problems to be Solved by the Invention

A power storage device becomes unusable at the point when the stored power is consumed and the required power cannot be extracted. In the case of a secondary battery, it can be reused when recharged. It is difficult to know the remaining amount and the degradation state of a power storage device, and it is also difficult to estimate how long the power storage device can be used.

In an electric vehicle and the like, the possible running distance is displayed on the basis of the remaining amount of the remaining power storage device, but may be shortened depending on how the vehicle is driven and road conditions. In the case of an electric vehicle, when degradation of a secondary battery proceeds, the time taken for one charge becomes longer and the possible running distance per one charge becomes shorter.

Furthermore, in some cases, a secondary battery rapidly degrades due to some reason or a short-circuit occurs between the electrodes, so that the secondary battery becomes unusable.

In particular, uninterruptible power supplies are said to be usable for a long time through conducting maintenance such as maintenance periodically and usable for five to ten years; however, defective products are sometimes included and thus might become unusable during use in some cases. Furthermore, since the lifetime of an uninterruptible power supply is determined by the battery provided inside, it is noted that the lifetime largely differs depending on the surrounding temperature or use environment; thus, the period of five to ten years is not a guaranteed period.

Thus, in the case where some sort of power failure actually occurs some years after installing the uninterruptible power supply, there is a possibility that the battery of the uninterruptible power supply has degraded due to some abnormality and power for the period required for the device cannot be secured. Note that the period required for a device indicates the time from the occurrence of a power breakdown to the start of power supply by a generator. In a large facility such as a data center, an uninterruptible power supply and a generator are installed in combination in preparation for a power breakdown.

In the case of a personal uninterruptible power supply, the period required for a device indicates the time to safely turn off the power of the device.

A user of an uninterruptible power supply can conduct replacement and the like of the uninterruptible power supply appropriately, if the user can know the degradation state of the battery. Technology that enables a user to know the degradation state of the battery more accurately or to predict the degradation of the battery has been desired.

Furthermore, a user of an uninterruptible power supply can reduce the replacement frequency by improving the place and environment of the installation of the uninterruptible power supply on the basis of the degradation state of the battery, leading to a reduction in the equipment cost. Furthermore, it is one object to provide a method for examining the remaining amount and the degradation state of a secondary battery of a device, not limited to an uninterruptible power supply, in a short time. In particular, a method for examining the remaining amount and the degradation state of a secondary battery with a large capacity in a short time is provided.

Means for Solving the Problems

In order to examine the remaining amount and the degradation state of an uninterruptible power supply, charge and discharge characteristics can be obtained. However, in order to obtain the charge and discharge characteristics, one cycle of discharging and charging the uninterruptible power supply needs to be conducted. In the case of a secondary battery with a large capacity, the time taken for one cycle becomes extremely long. The uninterruptible power supply is installed in the middle of a power line that connects an external power source and a precision equipment (for example, a server device that should be prevented from being shut down); therefore, in order to know the battery condition of the uninterruptible power supply in use, the procedure becomes large scale as follows: the uninterruptible power supply in use is replaced with an alternative that has been prepared to stop the use, removed from the power line, and then diagnosed. Furthermore, the charge and discharge data is obtained in such a manner that the uninterruptible power supply is disconnected from the power line, connected to a measurement device, discharged with a load application, and then charged; however, the procedure takes a long time depending on the capacity of the uninterruptible power supply and is very troublesome.

Furthermore, obtaining learning data to use an artificial intelligence requires a long period of time and obtainment of a large amount of data; thus, obtaining charge and discharge data multiple times through the above steps is unrealistic in the case of an uninterruptible power supply.

In view of this, data obtained through midway discharge and mid-to-full charge is used as the learning data to calculate the degradation state and the capacity. Learning data can be obtained while the uninterruptible power supply is used and the degradation state and the like can be known. The charge and discharge characteristics obtained through one cycle is not used as the learning data, whereby learning can be performed in a short time.

Furthermore, in a similar manner, data can be obtained even while an electric vehicle is running, with the use of data obtained through midway discharge and mid-to-full charge as the learning data, so that the degradation state of the secondary battery can be known. Note that a neural network is used to estimate the degradation state of the secondary battery. A neural network is a method and is neural network processing performed in a neural network portion (for example, including a CPU (Central Processor Unit), a GPU (Graphics Processing Unit), an APU (Accelerated Processing Unit), a memory, and the like). Note that an APU refers to a chip integrating a CPU and a GPU into one. The data used in the neural network portion is novel and characteristic. The data includes a discharge curve of midway discharge and a charge curve of mid-to-full charge, and by learning that data, abnormal detection can be performed.

The structure of the invention disclosed in this specification is a capacity estimation method for a power storage device including a plurality of lithium-ion secondary batteries and is a remaining capacity estimation method of a capacity in which a secondary battery with an SOC (State of Charge) of 100% is self-discharged during a first period either over time or with a constant load (S1), charged from an SOC of the self-discharged state to a fully charged state during a second period (S2), discharged to SOC 80% using a discharging circuit and charged to a fully charged state using a charging circuit during a third period (S3). Then, the remaining capacity at the fully charged state is calculated from the discharge data of the discharge to SOC 80% and the charge data from SOC 80% to SOC 100% by neural network processing (S4). SOC is preferably 90% or more in the first period. Note that an example of a flow chart is shown in FIG. 7.

In the above structure, the charging from SOC 80% to SOC 100% is performed by constant current charging or constant voltage charging. In a normal charging, a battery is fully charged by being charged by constant current charging until the battery voltage reaches a predetermined voltage, and then being charged at constant voltage after the voltage reaches the predetermined voltage. In this specification, the charge data from SOC 80% to SOC 100% includes the point where the switching occurs at the predetermined voltage, for instance the point where the SOC is 85%. As long as the point where constant current charging is switched to constant voltage charging is included, the range of the charging data is not particularly limited to SOC 80% to 100%.

In the above structure, the constant load is a resistor or a discharging circuit, and a switch between the lithium-ion secondary battery and the resistor or a switch between the lithium-ion secondary battery and the discharging circuit is provided, and the on/off state is switched by the switch.

Moreover, SOC refers to a charging state (also referred to as charging rate), and is an index in which the fully charged state is 100% and the completely discharged state is 0%.

Note that self-discharge is also called natural discharge, and refers to a phenomenon in which the battery capacity accumulated in a secondary battery gradually decreases over time, even when the secondary battery is not in use, due to a chemical reaction occurring little by little inside the secondary battery. The reduced battery capacity is likely to change depending on the temperature; thus, it is preferable to compare the capacity in a state of controlled temperature.

Furthermore, in the case where the internal resistance of a secondary battery is measured, a current-rest-method is used. The current-rest-method is a method for separating the internal resistance components by direct current and it stops current temporarily. An internal resistance corresponding to a voltage drop when the current is stopped can be calculated. Thus, the degree of deterioration can be determined from the internal resistance without putting excess stress on the battery.

Furthermore, a lithium-ion secondary battery is not limited to a secondary battery using an electrolytic solution and the present invention can also be applied to an all-solid-state secondary battery using a solid electrolyte. As examples of the solid electrolyte, high-molecular electrolytes and a variety of ceramics (for example, LAGP ($Li_{1.5}Al_{0.5}Ge_{1.5}(PO_4)_3$), $Li_{10}GeP_2S_{12}$), can be given. Examples of the high-molecular electrolyte include a high-molecular gel electrolyte containing an electrolyte solution and a high-molecular solid electrolyte not containing an electrolyte solution. In a high-molecular gel electrolyte, an electrolytic solution is injected into a polymer having a lithium-ion conductivity. Examples of the polymer having a lithium-ion conductivity include a polyethylene oxide (PEO) and a polypropylene oxide (PPO).

Effect of the Invention

A user can accurately know the degradation state of a secondary battery and check the results of the remaining capacity of the secondary battery calculated in the neural network portion in a short time. Furthermore, a device including a degradation state detection mechanism that detects the degradation state of a secondary battery can be provided. Moreover, a parameter for a user to determine the replacement timing of a secondary battery can be provided. In addition, a rapid degradation of a secondary battery can be detected in advance.

MODE FOR CARRYING OUT THE INVENTION

In the following description, embodiments of the present invention will be described in detail using the drawings. Note that the present invention is not limited to the description below, and it is easily understood by those skilled in the art that modes and details of the present invention can be modified in various ways. In addition, the present invention should not be construed as being limited to the description in the following embodiments.

Embodiment 1

In this embodiment, an example in which the present invention is applied to an electric vehicle (EV) is described with reference to FIG. 1 and FIG. 2.

Figure 1A:
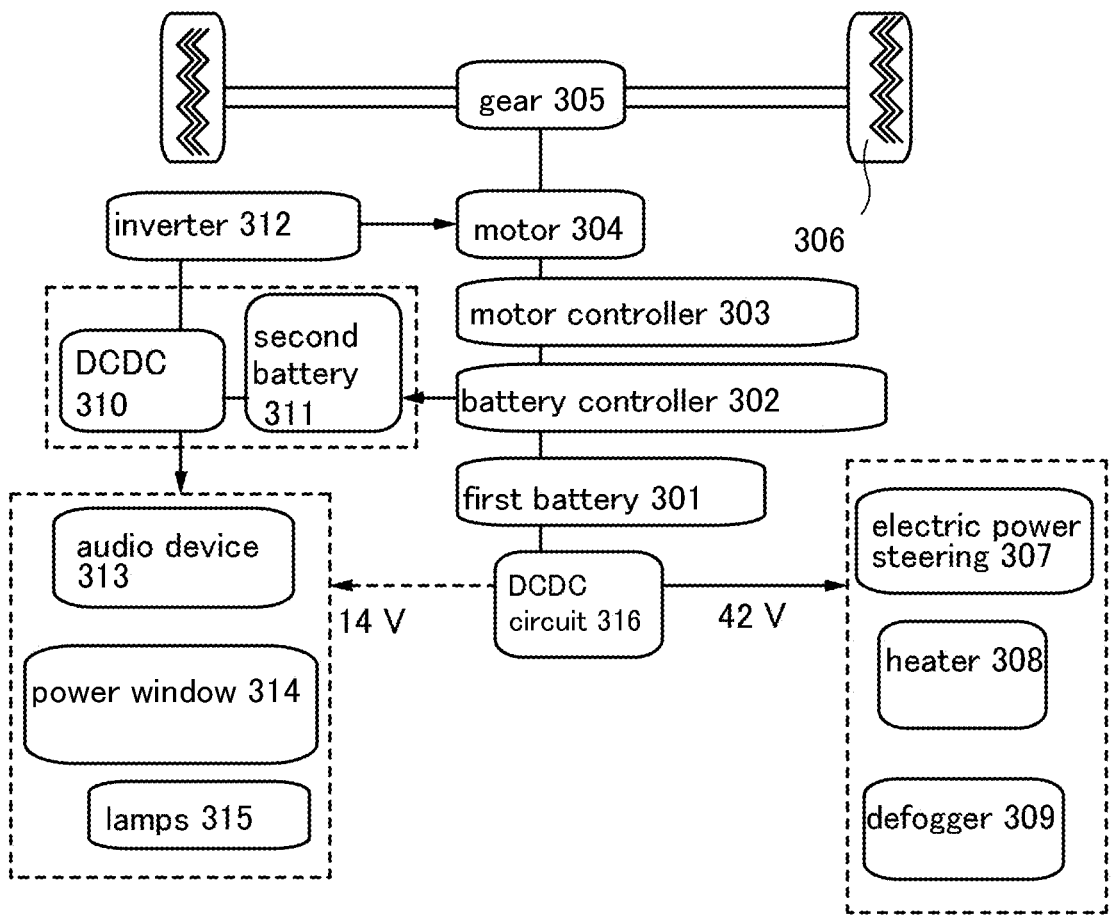
FIG. 1(A) is a block diagram illustrating one embodiment of the present invention and (B) is a graph of voltage and time illustrating charge after natural discharge.

An example of a block diagram of an electric vehicle is illustrated in FIG. 1(A).

On the electric vehicle, a first battery 301 as a main secondary battery for driving and a second battery 311 for supplying power to an inverter 312 that starts a motor 304 are installed.

The first battery 301 supplies power mainly to an in-vehicle device for a 42-V automobile and the second battery 311 supplies power to an in-vehicle device for a 14-V automobile. As the second battery 311, a lead storage battery is often adopted since it is advantageous in cost. A lead storage batter is more likely to self-discharge than a lithium-ion secondary battery, and thus is likely to degrade due to a phenomenon called sulfation. There is an advantage that the second battery 311 can be maintenance-free when it uses a lithium-ion secondary battery; however, in the case of long-term use, for example three years or more, abnormality that cannot be determined at the time of manufacturing might occur. In particular, when the second battery 311 that starts the inverter becomes inoperative, the motor cannot be started even when the first battery 301 has remaining capacity, thus, in order to prevent this, in the case where the second battery 311 is a lead storage battery, the second battery is supplied with power from the first battery to maintain the fully charged state.

In this embodiment, an example in which a lithium-ion secondary battery is used for both the first battery 301 and the second battery 311 is described.

A lithium-ion secondary battery includes a positive electrode, a negative electrode, a separator, an electrolyte solution, and an exterior body. Note that in a lithium-ion secondary battery, an anode and a cathode interchange in charging and discharging, and oxidation reaction and reduction reaction interchange; hence, an electrode with a high reaction potential is called a positive electrode and an electrode with a low reaction potential is called a negative electrode. For this reason, in this specification, a positive electrode is referred to as a "positive electrode" or a "+ electrode (plus electrode)" and a negative electrode is referred to as a "negative electrode" or a "– electrode (minus electrode)" in any of the case where charging is performed, the case where discharging is performed, the case where a reverse pulse current is made to flow, and the case where charging current is made to flow. The use of terms an "anode" and a "cathode" related to oxidation reaction and reduction reaction might cause confusion because the anode and the cathode interchange in charging and in discharging. Thus, the terms "anode" and "cathode" are not used in this specification. If the term "anode" or "cathode" is used, it should be clearly mentioned which of charging or discharging the anode or the cathode is in and to which of the positive electrode (plus electrode) or the negative electrode (minus electrode) the anode or the cathode corresponds to.

In this embodiment, an example of a lithium-ion secondary battery is described; however, without limitation to a lithium-ion secondary battery, as a positive electrode material of the secondary battery, an element A, an element X, and a material including oxygen can be used, for example. The element A is preferably one or more selected from the Group 1 elements and the Group 2 elements. As a Group 1 element, for example, an alkali metal such as lithium, sodium, or potassium can be used. As a Group 2 element, for example, calcium, beryllium, or magnesium, can be used. As the element X, for example, one or more selected from the metal elements, silicon, and phosphorus can be used. The element X is preferably one or more selected from cobalt, nickel, manganese, iron, and vanadium. Typical examples include lithium-cobalt composite oxide ($LiCoO_2$) and lithium iron phosphate ($LiFePO_4$).

The negative electrode includes a negative electrode active material layer and a negative electrode current collector. In addition, the negative electrode active material layer may contain a conductive additive and a binder.

For the negative electrode active material, an element that can perform charge-discharge reaction by alloying reaction and dealloying reaction with lithium can be used. For example, a material containing at least one of silicon, tin, gallium, aluminum, germanium, lead, antimony, bismuth, silver, zinc, cadmium, and indium can be used. Such elements have a higher capacity than carbon, and in particular, silicon has a high theoretical capacity of 4200 mAh/g.

In addition, the secondary battery preferably includes a separator. As the separator, for example, a fiber containing cellulose, such as paper; nonwoven fabric; a glass fiber; ceramics; a synthetic fiber containing nylon (polyamide), vinylon (polyvinyl alcohol-based fiber), polyester, acrylic, polyolefin, or polyurethane; can be used.

Furthermore, regenerated energy from the rotation of a tier 306 is transferred to the motor 304 via a gear 305 and charged to the second battery 311 or charged to the first battery 301 from a motor controller 303 and a battery controller 302.

Moreover, the first battery 301 is used mainly to rotate the motor 304, but also supplies power to an in-vehicle device for a 42-V automobile (an electric power steering 307, a heater 308, a defogger 309, and the like) via a DCDC circuit 316.

In addition, the second battery 311 supplies power to an in-vehicle device for a 42-V automobile (an audio device 313, a power window 314, lamps 315, and the like) via a DCDC circuit 310.

In the structure of the block diagram illustrated in FIG. 3, the battery controller 302 controls both the first battery 301 and the second battery 311 and includes a charging circuit. The battery controller 302 further includes a neural network portion, and abnormality detection, capacity estimation, and lifetime estimation of the first battery 301 and the second battery 311 are conducted by respective programs included in the neural network portion. Each program for performing capacity estimation and lifetime estimation sometimes partially uses a common value or a common calculation, and in the case where a common value or a common calculation is used, the calculation time can be shortened since the calculation can be done efficiently.

In the case where the degradation state of the first battery 301 is analyzed, the second battery 311 is used. In addition, in the case where the degradation state of the second battery 311 is analyzed, the first battery 301 is used.

Figure 1B:
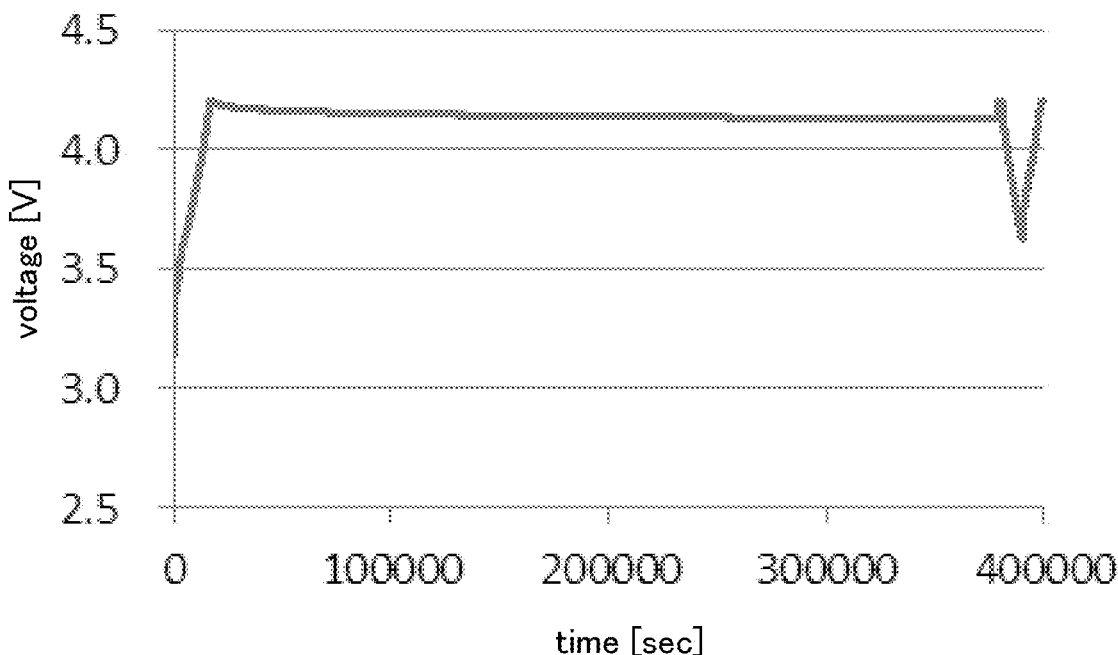

FIG. 1(B) is a graph showing voltage and time obtained in the following manner: one of the plurality of secondary batteries of the second battery 311 is fully charged; naturaldischarged; charged from the point where the voltage decreased to a first voltage to a second fully charged state; discharged to a second voltage by a discharge circuit or a load; and then charged to a third fully charged state.

Figure 2A:
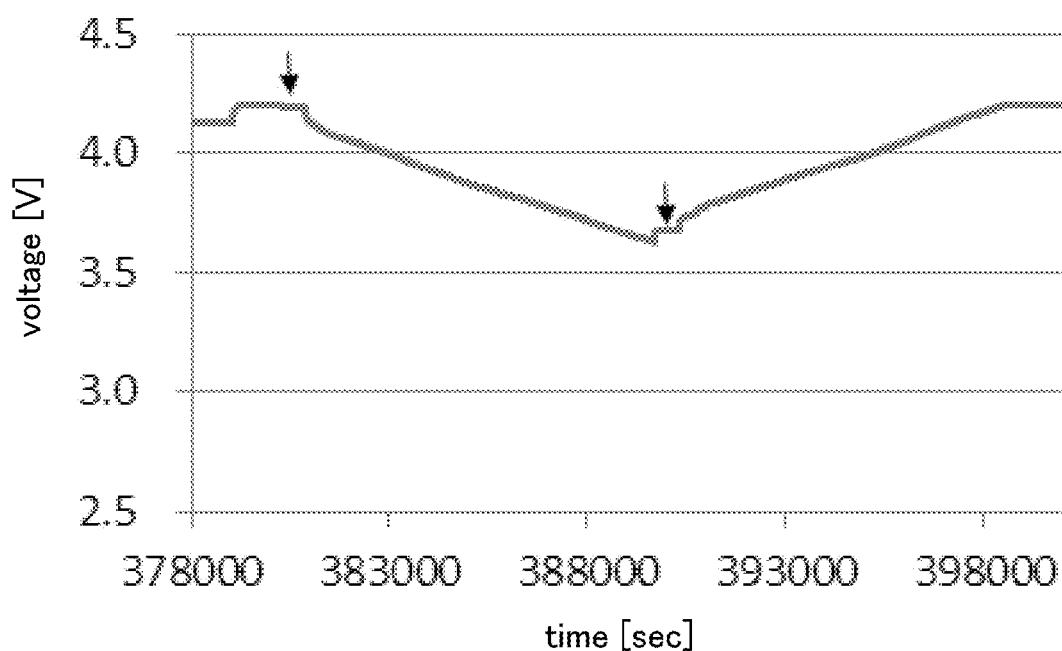
FIG. 2(A) is a graph of voltage and time illustrating one embodiment of the present invention and (B) is a graph of current and voltage.
Figure 2B:
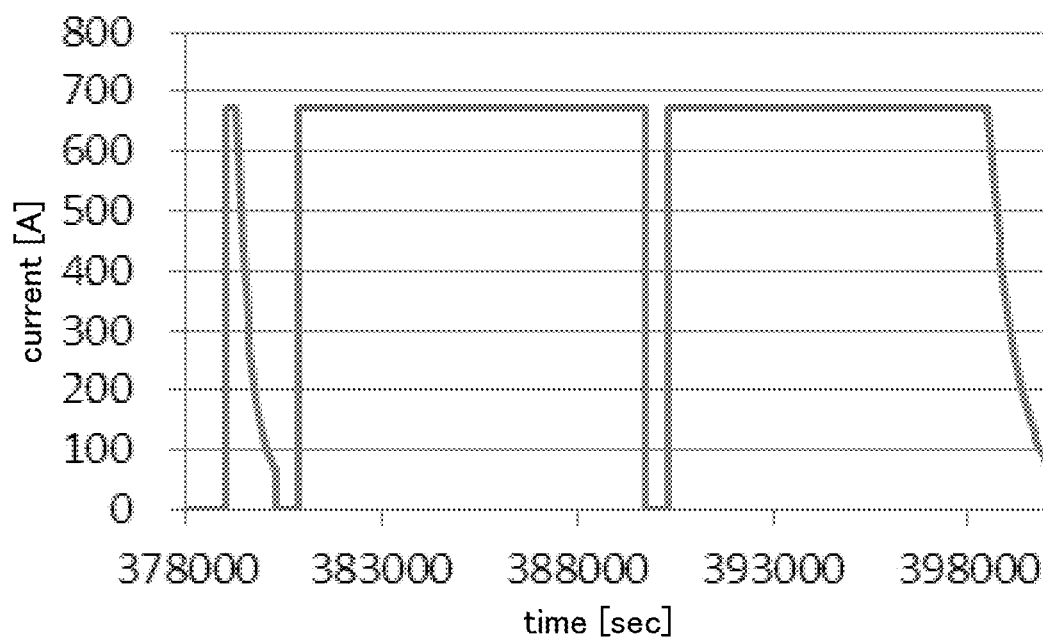

In addition, FIG. 2(A) corresponds to an enlarged graph of the time 378000 seconds to 398000 seconds on the horizontal axis in FIG. 1(B). Furthermore, FIG. 2(B) is a graph of current and time that corresponds to FIG. 2(A). As shown in FIG. 2(B), the full charge voltage is set to 4.2 V and current supply is stopped at the fully charged state. Resistance measurement by current-rest-method is performed when the current supply is stopped to calculate the resistance value, whereby data is obtained.

In this embodiment, the voltage curve from the second fully charged state to the third fully charged state, which is shown in FIG. 1(B) and FIG. 2(A) is learned in the neural network portion, and the programs therein perform abnormality detection, capacity estimation, and lifetime estimation. As described in this embodiment, in order to maintain a state where the battery capacity remains, discharging is performed only midway, to 3.7 V at maximum.

When the secondary battery is in what is called a completely discharged state where the voltage is lowered to the lowest level, the degradation of the battery might be accelerated; however, in this embodiment, discharge is performed only midway, and thus characteristics of the battery can be maintained. Furthermore, since the battery capacity is maintained, abnormality detection, capacity estimation, and lifetime estimation can be performed even when the battery is connected to a device.

According to this embodiment, degradation prediction by an AI (AI: Artificial Intelligence) system can be performed periodically on the second battery 311 and a user can determine the replacement timing of the battery on the basis of the result.

For the operating system of the software that forms the AI system, a variety of operating systems such as Windows (registered trademark), UNIX (registered trademark), and macOS (registered trademark) can be used. A variety of programing languages such as Python, Go, Perl, Ruby, Prolog, Visual Basic, C, C++, Swift, Java (registered trademark), and NET can be used to write the software program. Furthermore, the application may be formed using a framework such as Chainer (it can be used with Python), Caffe (it can be used with Python and C++), and TensorFlow (it can be used with C, C++, and Python). A CNN model requires a lot of convolution processing. Since convolution processing uses product-sum operation, an LSI chip which can configure a power saving product-sum operation circuit, especially a transistor fabricated with an oxide semiconductor material can be used for the IC chip. An IC incorporating an AI system is referred to as a circuit which performs neural network operation (microcomputer) in some cases.

Furthermore, data obtained periodically is input to the neural network portion to perform learning and a feature value is extracted by operation in the neural network processing, so that the state of the secondary battery is analyzed more accurately. Note that a system may be employed in which the learning data is accumulated in an external server using a communication function, neural network processing is performed in an external device to calculate a weight coefficient and the like, and then the charge of the secondary battery is controlled from the outside in accordance with the weight coefficient and the like.

For example, neural network processing can be used for the prediction and detection of an occurrence of abnormality of the secondary battery (specifically, an occurrence of a micro short circuit).

A micro short circuit refers to a minute short-circuit in a secondary battery and refers to a phenomenon that does not make charge and discharge impossible by the short-circuit, but causes a slight short circuit current to flow in a minute short circuit portion. It is said that one of the factors of a micro short circuit is as follows: when charge and discharge are performed multiple times or when the distribution of a positive electrode active material is nonuniform, local current concentration occurs in part of a positive electrode and in part of a negative electrode, which generates a portion where a separator does not function partly and generates a product due to a side reaction, leading to the occurrence of a micro short circuit. Furthermore, it is said that, one of the factors of a micro short circuit is the metal powder that enters the secondary battery at the time of the production.

As an ideal secondary battery, a thinner separator is desired for a smaller secondary battery, and furthermore, charge by high-speed power feeding at a high voltage is desired, both of which have a structure where a micro short circuit easily occurs in a secondary battery. In addition, repeated occurrence of a micro short circuit might lead to a critical accident such as abnormal heat generation and firing of the secondary battery.

Thus, according to this embodiment, a control system and a capacity estimation system for a secondary battery for preventing a critical accident in advance by early detection of a micro short circuit can be formed.

Embodiment 2

In this embodiment, an example of the neural network processing performed in the battery controller 302 described in Embodiment 1 is illustrated in FIG. 3.

Figure 3A:
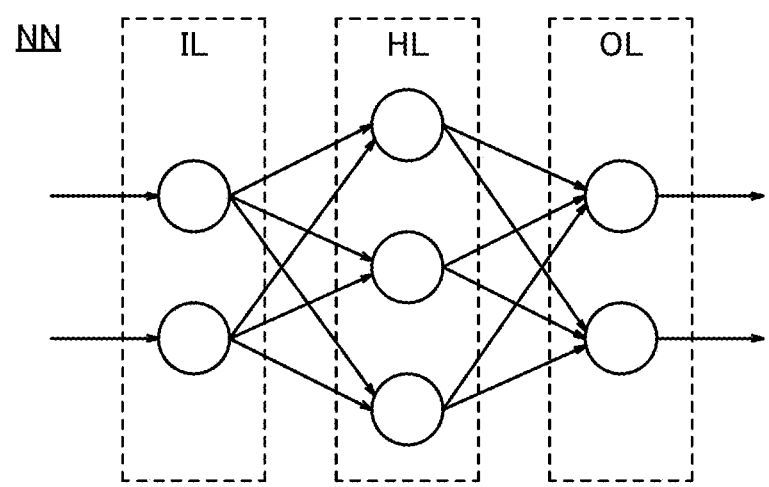
FIG. 3 A diagram illustrating a configuration example of neural network processing.

As illustrated in FIG. 3(A), neural network processing NN can be formed of an input layer IL, an output layer OL, and a middle layer (hidden layer) HL. The input layer IL, the output layer OL, and the middle layer HL each include one or more neurons (units). Note that the middle layer HL may be composed of one layer or two or more layers. Neural network processing including two or more middle layers HL can also be referred to as DNN (deep neural network), and learning using deep neural network processing can also be referred to as deep learning.

Input data are input to each neuron of the input layer IL, output signals of neurons in the previous layer or the subsequent layer are input to each neuron of the middle layer HL, and output signals of neurons in the previous layer are input to each neuron of the output layer OL. Note that each neuron may be connected to all the neurons in the previous and subsequent layers (full connection), or may be connected to some of the neurons.

Figure 3B:
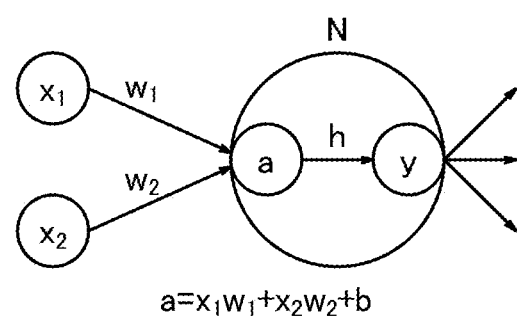

FIG. 3(B) shows an example of an operation with the neurons. Here, a neuron N and two neurons in the previous layer which output signals to the neuron N are shown. An output $x_1$ of the neuron in the previous layer and an output $x_2$ of the neuron in the previous layer are input to the neuron N. Then, in the neuron N, a total sum $x_1w_1+x_2w_2$ of the product of the output $x_1$ and a weight $w_1(x_1w_1)$ and the product of the output $x_2$ and a weight $W_2(x_2w_2)$ is calculated, and then a bias b is added as necessary, so that a value $a=x_1w_1+x_2w_2+b$ is obtained. Then, the value a is converted with an activation function h, and an output signal $y=h(a)$ is output from the neuron N.

In this manner, operation that adds the products of an input data and a weight together, in other words, product-sum operation is included in an operation with a neuron. This product-sum operation can be performed by a product-sum operation circuit MAC that includes a current source circuit CM, an offset absorption circuit OFS, and a cell array. Furthermore, the conversion of a signal by the activation function h can be performed by a layer output circuit OU. In other words, operation of the middle layer HL or the output layer OL can be performed by an operation circuit AC.

A cell array included in a product-sum operation circuit is composed of a plurality of memory cells arranged in a matrix.

The memory cells have a function of storing the first data. The first data is data corresponding to a weight between neurons in neural network processing. Furthermore, the memory cells have a function of multiplying the first data and the second data input from the outside of the cell array. In other words, the memory cells have a function of a memory circuit and a multiplier circuit.

Note that in the case where the first data is analog data, the memory cells have a function of an analog memory. Furthermore, in the case where the first data is multilevel data, the memory cells have a function of a multilevel memory.

Then, the results of the multiplication by the memory cells in the same column are added. Accordingly, the product-sum operation of the first data and the second data is performed. Then, the result of the operation by the cell array is output as the third data to the layer output circuit OU.

The layer output circuit OU has a function of converting the third data output from the cell array in accordance with a predetermined activation function. An analog signal or a multilevel digital signal output from the layer output circuit OU corresponds to the output data of the middle layer or the output layer of the neural network processing NN.

As the activation function, a sigmoid function, a tan h function, a softmax function, a ReLU function, a threshold function, and the like can be used. The signal converted by the layer output circuit OU is output as analog data or multilevel digital data (data $D_{analog}$).

In this manner, the operation of one of the middle layer HL and the output layer OL of the neural network processing NN can be performed by one operation circuit AC. Note that the product-sum operation circuit MAC and the layer output circuit OU included in the operation circuit AC[k](k is an integer of 1 or more and N or lower) are referred to as a product-sum operation circuit MAC[k] and a layer output circuit OU[k], respectively. Furthermore, the analog data or multilevel digital data output from the operation circuit AC[k] is referred to as data $D_{analog}[k]$.

Analog data or multilevel digital data output from a first operation circuit AC is supplied to a second operation circuit AC as the second data. Then, the second operation circuit AC performs an operation using the first data stored in the memory cell and the second data input from the first operation circuit AC. Accordingly, operation of the neural network processing including a plurality of layers can be performed.

Specifically, various pieces of data obtained is evaluated and learned using machine learning or an artificial intelligence, the estimated degree of degradation is analyzed, and then the user is notified if there is any abnormality.

This embodiment can be freely combined with Embodiment 1.

Embodiment 3

Figure 4:
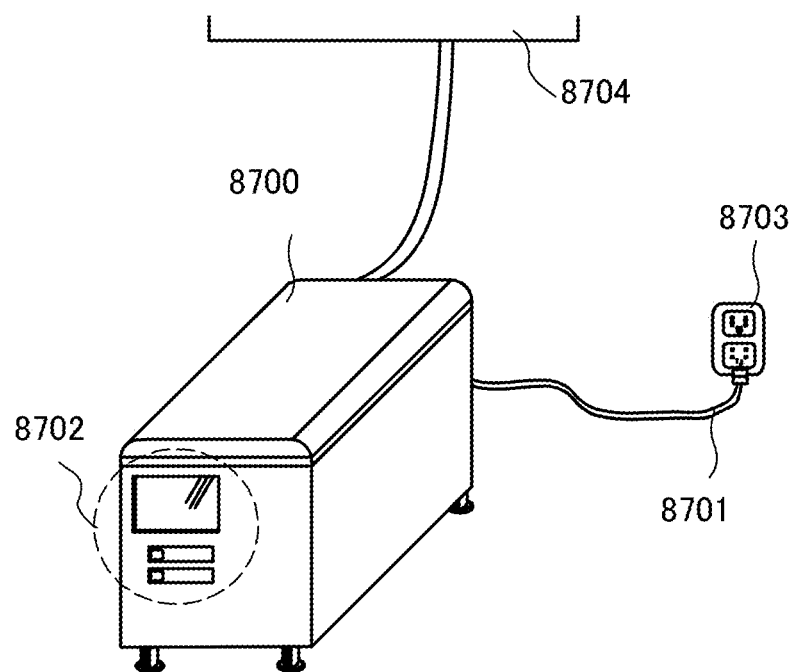
FIG. 4 A perspective view of an uninterruptible power supply illustrating one embodiment of the present invention.

In this embodiment, an example of an uninterruptible power supply is described. An uninterruptible power supply 8700 illustrated in FIG. 4 includes at least a secondary battery, a protection circuit, a charging control circuit and a neural network portion inside, and may also include a mechanism for performing communication with or without a wire, a display panel 8702 for displaying the operating state and the like, for example.

A power cord 8701 of the uninterruptible power supply 8700 is electrically connected to a system power supply 8703. The uninterruptible power supply 8700 is electrically connected to precision equipment 8704. The precision equipment 8704 indicates, for example, a server device that should be prevented from being shut down. In the uninterruptible power supply 8700, a plurality of secondary batteries are connected in series or in parallel to achieve a desired voltage (for example, 80 V or more, 100 V, or 200 V).

As the secondary battery, a lithium-ion secondary battery including a positive electrode, a negative electrode, a separator, an electrolytic solution, and an exterior body is used.

The secondary battery is not limited to a lithium-ion secondary battery and as a positive electrode material of the secondary battery, a material including an element A, an element X, and oxygen can be used, for example. The element A is preferably one or more selected from the Group 1 elements and the Group 2 elements. As a Group 1 element, for example, an alkali metal such as lithium, sodium, or potassium can be used. As a Group 2 element, for example, calcium, beryllium, or magnesium can be used. As the element X, for example, one or more selected from the metal elements, silicon, and phosphorus can be used. The element X is preferably one or more selected from cobalt, nickel, manganese, iron, and vanadium. Typical examples include lithium-cobalt composite oxide ($LiCoO_2$) and lithium iron phosphate ($LiFePO_4$).

Furthermore, an all solid-state secondary battery can be used as the secondary battery of the uninterruptible power supply 8700. In the case of using the all solid-state secondary battery, a solid electrolyte is used, but an electrolytic solution is not used. Note that a separator is not necessarily used.

The degradation of the uninterruptible power supply 8700 is affected by various factors. In the case where the user installs the uninterruptible power supply 8700 inside or outside of the room, the degradation is also affected by the size of the room for installation, the room temperature, change in the temperature of the installation environment, and the like.

According to this embodiment, degradation prediction by an AI (AI: Artificial Intelligence) can be performed periodically on the secondary battery of the uninterruptible power supply 8700 and a user can determine the replacement timing of the battery on the basis of the result.

Furthermore, data obtained periodically is input to the neural network portion to perform learning and a feature value is extracted by operation in the neural network processing, so that the state of the secondary battery is analyzed more accurately.

For example, the neural network processing can be used for the prediction and detection of an occurrence of abnormality of the secondary battery (specifically, an occurrence of a micro short circuit).

As an ideal secondary battery, a thinner separator is desired for a smaller secondary battery, and furthermore, charge by high-speed power feeding at a high voltage is desired, both of which have a structure where a micro short circuit easily occurs in a secondary battery. In addition, repeated occurrence of a micro short circuit might lead to a critical accident such as abnormal heat generation and firing of the secondary battery.

Thus, according to this embodiment, a control system and a capacity estimation system for a secondary battery for preventing a critical accident in advance by early detection of a micro short circuit can be formed.

Embodiment 4

In this embodiment, an example of a vehicle equipped with a capacity estimation system of one embodiment of the present invention is described. Examples of the vehicle include automobiles, motorcycles, bicycles, and the like.

By incorporating a power storage system with a neural network portion that performs neural network processing in a vehicle, a next-generation clean energy vehicle such as a hybrid electric vehicle (HEV), an electric vehicle (EV), and a plug-in hybrid electric vehicle (PHEV) can be achieved.

Figure 5:
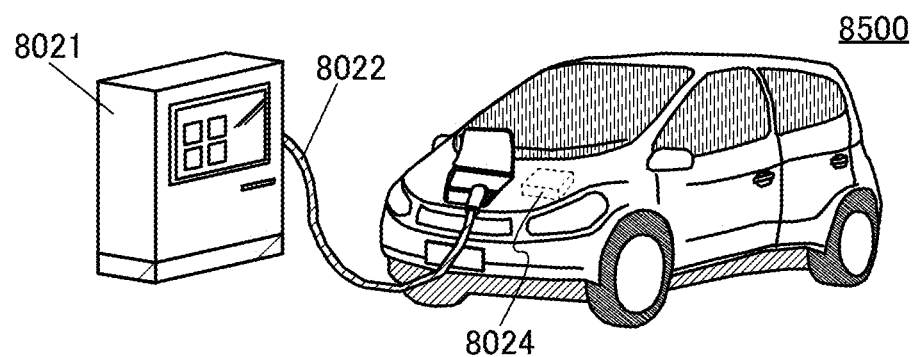
FIG. 5 An example of a vehicle.

FIG. 5 illustrates an example of a vehicle using the capacity estimation system of one embodiment of the present invention. An automobile 8500 illustrated in FIG. 5 is an electric vehicle that uses an electric motor as a power source for driving. Alternatively, the automobile 8500 is a hybrid electric vehicle that can appropriately select a power source from an electric motor and an engine while driving. In the automobile 8500, a secondary battery 8024 of the automobile 8500 is charged from a charger 8021 through a cable 8022. The automobile 8500 includes a capacity estimation system that performs neural network processing shown with FIG. 3 as an example. With the use of the capacity estimation system that performs neural network processing, the degradation of the secondary battery is monitored and the replacement titling of the secondary battery can be notified to the user. Furthermore, the capacity estimation system that performs neural network processing can also monitor abnormality detection of the secondary battery and allow a user to take action before the situation becomes serious. Furthermore, the power storage system is used not only for driving the electric motor of the automobile 8500, but also for supplying power to a light-emitting device such as a headlight or a room light (not illustrated). Since devices used in the vehicle are driven at a voltage of 11.5 V or higher and 14.5 V or lower, the devices are used by changing the power source voltage from a battery appropriately in a boosting circuit and the like.

In addition, the power storage system can also supply power to a display device of a speedometer, a tachometer, and the like included in the automobile 8500. Furthermore, the power storage system can supply electric power to a navigation system and the like included in the automobile 8500.

Furthermore, although not illustrated, a power receiving device can be incorporated in the vehicle, and the vehicle can be charged by being supplied with power from an above-ground power transmitting device in a contactless manner. In the case of this contactless power feeding system, charging can be performed by a power transmitting device incorporated in a road or an exterior wall, not only when the vehicle is stopped but also when driven. In addition, this contactless power feeding system may be utilized to transmit and receive power between vehicles. Furthermore, a solar cell may be provided in the exterior of the vehicle to charge the secondary battery while the vehicle is stopped or while the vehicle is driven. For supply of power in such a contactless manner, an electromagnetic induction method or a magnetic resonance method can be used.

Figure 6A:
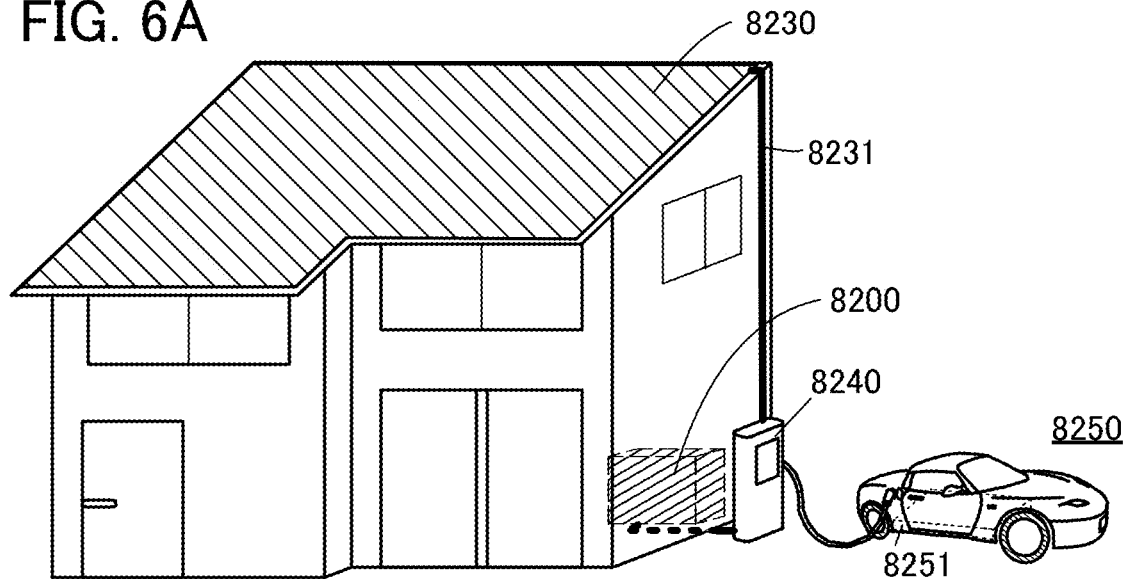
FIG. 6 An application example of a capacity estimation system.

FIG. 6 illustrates other examples of a power storage system and an electronic device. FIG. 6(A) illustrates an example of a house including a power storage system 8200 including a capacity estimation system of one embodiment of the present invention, and a solar panel 8230. The house is preferably equipped with a ground-based charging apparatus 8240. Furthermore, the power storage system 8200 preferably includes a protection circuit, a control circuit, and a neural network portion. Power obtained by the solar panel 8230 is stored in a secondary battery of the power storage system 8200. The power storage system 8200 may be provided with a capacity estimation system including a neural network portion, and the degradation of the secondary battery included in the power storage system 8200 is monitored so as to notify the replacement timing of the secondary battery to the user.

Furthermore, the capacity estimation system including a neural network portion can be incorporated in the ground-based charging apparatus 8240. In the ground-based charging apparatus 8240, the degradation of the secondary battery included in the ground-based charging apparatus 8240 is monitored so as to notify the replacement timing of the secondary battery of the ground-based charging apparatus 8240 to the user. Moreover, by the capacity estimation system including a neural network portion incorporated in the automobile 8250, the degradation of the secondary battery is monitored so as to notify the replacement timing of the secondary battery of the automobile 8250 to the user. Furthermore, the capacity estimation system including a neural network portion can also monitor abnormality detection of the secondary battery of the automobile 8250 and allow a user to take action before the situation becomes serious.

The power storage system 8200, the solar panel 8230, and the charging apparatus 8240 are electrically connected to each other through a wiring 8231 and the like. The power generated by the solar panel 8230 can be charged to the power storage system 8200. The power stored in the power storage system 8200 can be charged to a storage battery 8251 included in the automobile 8250 via the ground-based charging apparatus 8240. Note that the automobile 8250 is an electric vehicle or a plug-in hybrid electric vehicle.

Figure 6B:
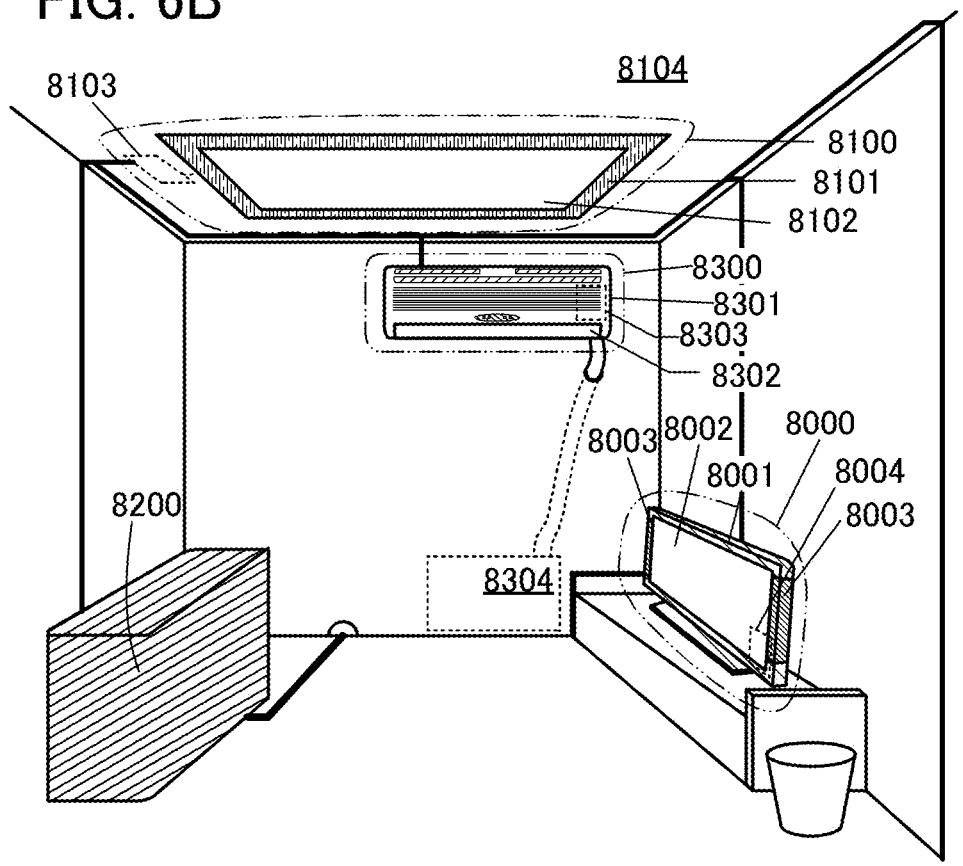
Figure 7:
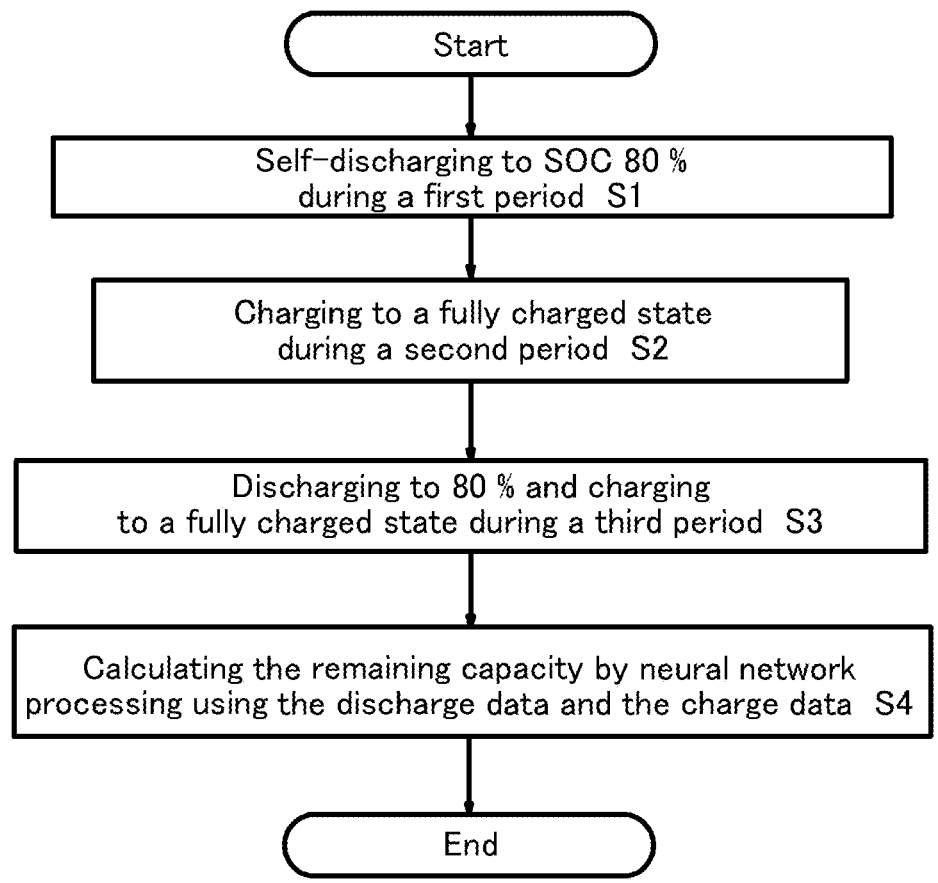
FIG. 7 An example of a flow.

The power stored in the power storage system 8200 can be supplied to other electronic devices installed indoors. For example, as illustrated in FIG. 6(B), the power can be supplied to a lighting device 8100 by electrically connecting the power storage system 8200 to the lighting device 8100 which is of an installation type. The lighting device 8100 includes a housing 8101, a light source 8102, a control circuit 8103, and the like. The lighting device 8100 can receive power supply from a commercial power supply or can use the power stored in the power storage system 8200. Thus, with the use of the power storage system 8200 as an uninterruptible power supply, the lighting device 8100 can be used even when power cannot be supplied from a commercial power supply due to power breakdown or the like.

Note that, FIG. 6(B) shows the example of the lighting device 8100 which is of an installation type provided in a ceiling 8104; however, the power storage system 8200 can supply power, for example, to an installation lighting device provided in a wall, a floor, a window, and the like other than the ceiling 8104, or can supply power to a tabletop lighting device and the like.

In addition, an artificial light source that obtains light artificially by using power can be used as the light source 8102. Specifically, an incandescent lamp, a discharge lamp such as a fluorescent lamp, and a light-emitting element such as an LED and an organic EL element are given as examples of the artificial light source.

Similarly, the power storage system 8200 can supply power to a display device 8000. The display device 8000 includes a housing 8001, a display portion 8002, a speaker portion 8003, a control circuit 8004, and the like. The display device 8000 can receive power supply from a commercial power supply, or can use power stored in the power storage system 8200.

A semiconductor display device such as a liquid crystal display device, a light-emitting device in which a light-emitting element such as an organic EL element is provided in each pixel, an electrophoresis display device, a DMD (Digital Micromirror Device), a PDP (Plasma Display Panel), or an FED (Field Emission Display) can be used for the display portion 8002.

Note that a display device includes all of display devices for displaying information for personal computers, advertisement display, and the like besides that for TV broadcast reception.

Similarly, the power storage system 8200 can supply power to an air conditioner including an indoor unit 8300 and an outdoor unit 8304. The indoor unit 8300 includes a housing 8301, an air outlet 8302, a control circuit 8303, and the like. The air conditioner can receive power supply from a commercial power supply, or can use power stored in the power storage system 8200.

Note that although a split-type air conditioner composed of an indoor unit and an outdoor unit is illustrated in FIG. 6(B), power can also be supplied from the secondary battery to an integrated air conditioner in which one housing has the function of an indoor unit and the function of an outdoor unit.

This embodiment can be combined with the description of the other embodiments as appropriate.

REFERENCE NUMERALS

301 first battery, 302 battery controller, 303 motor controller, 304 motor, 305: gear, 306: tier, 307: electric power steering, 308: heater, 309: defogger, 310: DCDC circuit, 311 second battery, 312 inverter, 313 audio device, 314: power window, 315: lamps, 316: DCDC circuit, 8000: display device, 8001: housing, 8002: display portion, 8003: speaker portion, 8004: control circuit, 8021: charger, 8022: cable, 8024: secondary battery, 8100: lighting device, 8101: housing, 8102: light source, 8103: control circuit, 8104: ceiling, 8200: power storage system, 8230: solar panel, 8231: wiring, 8240: charging apparatus, 8250: automobile, 8251: storage battery, 8300: indoor unit, 8301: housing, 8302: air outlet, 8303: control circuit, 8304: outdoor unit, 8500: automobile, 8700: uninterruptible power supply, 8701: power cord, 8702: display panel, 8703: system power supply, 8704: precision equipment.

The invention claimed is:

1. A capacity estimation method for a power storage device comprising a plurality of lithium-ion secondary batteries, comprising:
   performing self-discharging of a secondary battery with an SOC of 100% over time during a first period;
   charging the secondary battery from an SOC of a self-discharged state to a fully charged state during a second period;
   discharging the secondary battery to SOC 80% using a discharging circuit during a third period;
   charging the secondary battery to a fully charged state using a charging circuit during a fourth period;
   obtaining a first charge-discharge data during the third period and the fourth period; and
   calculating a degradation state from the first charge-discharge data by neural network processing.

2. The capacity estimation method according to claim 1, wherein the power storage device is installed in an uninterruptible power supply system, and
   wherein the charge from SOC 80% to SOC 100% is performed by constant voltage charging.

3. The capacity estimation method according to claim 1, wherein the power storage device is a lithium-ion secondary battery installed inside an uninterruptible power supply.

4. The capacity estimation method according to claim 1, wherein the power storage device is a lithium-ion secondary battery installed inside a vehicle.

5. A capacity estimation system for a power storage device comprising a plurality of lithium-ion secondary batteries connected in series, comprising:
   performing self-discharging of a secondary battery with an SOC of 100% with a constant load during a first period;
   charging the secondary battery from an SOC of a self-discharged state to a fully charged state during a second period;
   discharging the secondary battery to SOC 80% using a discharging circuit during a third period;
   charging the secondary battery to a fully charged state using a charging circuit during a fourth period to obtain a first charge data; and
   calculating a degradation state from the first charge data by neural network processing.

6. The capacity estimation system according to claim 5, wherein the power storage device is a lithium-ion secondary battery installed inside an uninterruptible power supply.

7. The capacity estimation system according to claim 5, wherein the power storage device is a lithium-ion secondary battery installed inside a vehicle.

8. A capacity estimation method for a power storage device, comprising:
   preparing a first secondary battery as a test cell;
   performing self-discharging of the first secondary battery with an SOC of 100% with a constant load during a first period;
   charging the first secondary battery from an SOC of a self-discharged state to a fully charged state during a second period;
   discharging the first secondary battery to SOC 80% during a third period;

charging the first secondary battery to a fully charged state during a fourth period;
obtaining learning data comprising the charge data during the fourth period;
learning the learning data in a neural network portion;
charging a second secondary battery from SOC 80% to a fully charged state; and
calculating a degradation state of the second secondary battery by the neural network portion after learning.

* * * * *